(12) United States Patent
Wong

(10) Patent No.: US 6,745,356 B1
(45) Date of Patent: Jun. 1, 2004

(54) SCANNABLE STATE ELEMENT ARCHITECTURE FOR DIGITAL CIRCUITS

(75) Inventor: Paul Wong, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 332 days.

(21) Appl. No.: 09/784,863

(22) Filed: Feb. 15, 2001

(51) Int. Cl.$^7$ .............................................. G01R 31/28
(52) U.S. Cl. ........................................ 714/726; 326/16
(58) Field of Search ............................... 714/726, 731; 712/1; 327/202; 326/93, 16

(56) References Cited

U.S. PATENT DOCUMENTS

| | | | | |
|---|---|---|---|---|
| 4,860,290 A | * | 8/1989 | Daniels et al. ............... | 714/726 |
| 5,875,346 A | * | 2/1999 | Luick ............................ | 712/1 |
| 6,219,811 B1 | * | 4/2001 | Gruetzner et al. .......... | 714/726 |
| 6,380,780 B1 | * | 4/2002 | Aitken et al. ............... | 327/202 |

* cited by examiner

Primary Examiner—Albert Decady
Assistant Examiner—Dipakkumar Gandhi
(74) Attorney, Agent, or Firm—Fenwick & West LLP

(57) ABSTRACT

The present invention relates to an improved digital circuit design employing scannable state elements. In one embodiment, a digital circuit design includes a first functional latch coupled to a first logic block and a second functional latch coupled to a second logic block. The functional latches are in separate scan chains and receive their own respective scan in inputs. The functional latches are both coupled to a common holding latch that captures content from the functional latches. In another embodiment, the digital circuit design includes two logic blocks that are coupled to a scannable state element. The functional latch is disposed within two different scan chains and receives scan in inputs from both scan chains. The functional latch may test the first and second logic blocks to provide controllability and observability. By sharing a common scannable state element, the invention reduces overhead and space in the circuit design.

31 Claims, 8 Drawing Sheets

SCANNABLE STATE ELEMENT ARCHITECTURE FOR DIGITAL CIRCUITS

BACKGROUND

1. Field of the Invention

The present invention relates generally to the digital design architecture that employs scannable state elements for the testing of logic, and more particularly, to an apparatus and a method for reducing the overhead associated with scannable state elements.

2. Description of the Background Art

Digital circuit designs commonly include state elements, such as latches or flip-flops. Such designs may further employ a full scan design that advantageously provides controllability and observability of internal logic in a circuit. For designs that employ a scan, the state elements are usually scannable. The scannable state elements are further disposed within defined scan paths. During a full scan, scannable state elements may receive random data from a pseudo random pattern generator (PRPG) or deterministic scan vectors from a tester. Based on the received random data, the scannable state elements provide valid values which may be analyzed during testing.

Each scannable state element holds an internal state of a circuit. For diagnostics, it is desirable to enable scanning of state elements within a scan path so internal states can be observed and controlled. Improved controllability may be achieved by coupling a scannable state element and a multiplexor to logic. The internal nodes of the logic may be controlled by scanning in a new state value through the scannable state element. Improved observability may be achieved by coupling a scannable state element to logic. The internal nodes of the logic may be captured and scanned through the scannable state element. Without the scanning functionality, it is not possible to test logic in this manner.

Although scannable state elements are desired, there is a high overhead associated with scannability. Scannable state elements require a substantial increase in the amount of hardware, such as the number of transistors. This is understandable as modern digital design commonly employs hundreds of thousands of state elements. As technology progresses, the number of state elements will likely increase to millions of state elements. The increased hardware requires additional space. As space is a very limited commodity in circuit design, scannability becomes a costly feature. Scannable state elements further result in increased capacitive loading and an increased number of gates for testing. The increased capacitive loading and number of gates slows down scanning and reduces overall performance of the circuit design.

It would therefore be an advancement in the art to provide a digital circuit design having scanning capability while reducing the requisite overhead. It would be a further advancement in the art to provide a scannable digital circuit design with a reduced number of scannable state elements. It would be a further advancement in the art to provide such a digital circuit design while still providing observability and controllability. Such an invention is disclosed and claimed herein.

SUMMARY OF THE INVENTION

The present invention relates to an improved digital circuit design employing scannable state elements. Scannability allows for improved testing of complex logic by controlling and observing the internal nodes of the complex logic. The present invention improves scan design by sharing components of the scannable state elements.

In one embodiment a digital circuit design includes a first functional latch coupled to a first logic block to test the first logic block. The functional latch is disposed within a scan chain and receives a first scan input. A second functional latch is coupled to a second logic block to test the second logic block. The second functional latch is disposed within a second scan chain and receives a second scan input. The functional latches are coupled to a holding latch that captures content from the functional latches. By having the latches share a common holding latch, the scan design reduces overhead and space.

In another embodiment, the digital circuit design includes a first logic block and a second logic block that are coupled to a scannable state element. The scannable state element may include a functional latch and a holding latch that captures content from the functional latch. The functional latch may test the first and second logic blocks to provide controllability and observability. The functional latch is disposed within two different scan chains and receives scan inputs from both scan chains. Because the scan chains share a common functional latch, the scans must run separately to avoid a conflict. In both embodiments, the invention provides improved controllability and/or observability by sharing a common holding latch or a common scannable state element. By sharing components, the invention reduces overhead, capacitive loading, and timing delays. The invention further provides for additional space which is very limited in digital circuit architecture.

The features and advantages described in this summary and the following detailed description are not all-inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

In order that the manner in which the advantages and features of the invention are obtained, a more particular description of the invention summarized above will be rendered by reference to the appended drawings. Understanding that these drawings only provide selected embodiments of the invention and are not therefore to be considered limiting of the scope, the invention will be described and explained with additional specificity and detail through the use of the accompanying drawings in which.

DETAILED DESCRIPTION OF THE PREFERRED EMBODIMENTS

A preferred embodiment of the invention is now described with reference to the Figures, where like reference numbers indicate identical or functionally similar elements. The components of the present invention, as generally described and illustrated in the Figures, may be implemented in a wide variety of configurations. Thus, the following more detailed description of the embodiments of the system and method of the present invention, as represented in the Figures, is not intended to limit the scope of the invention, as claimed, but is merely representative of presently preferred embodiments of the invention.

The present invention relates to an improved digital circuit design employing scannable state elements. A scan design requires that scannable state elements be disposed throughout a circuit architecture. Scannability allows for improved testing of complex logic by controlling and observing the internal nodes of the complex logic.

Figure 1:
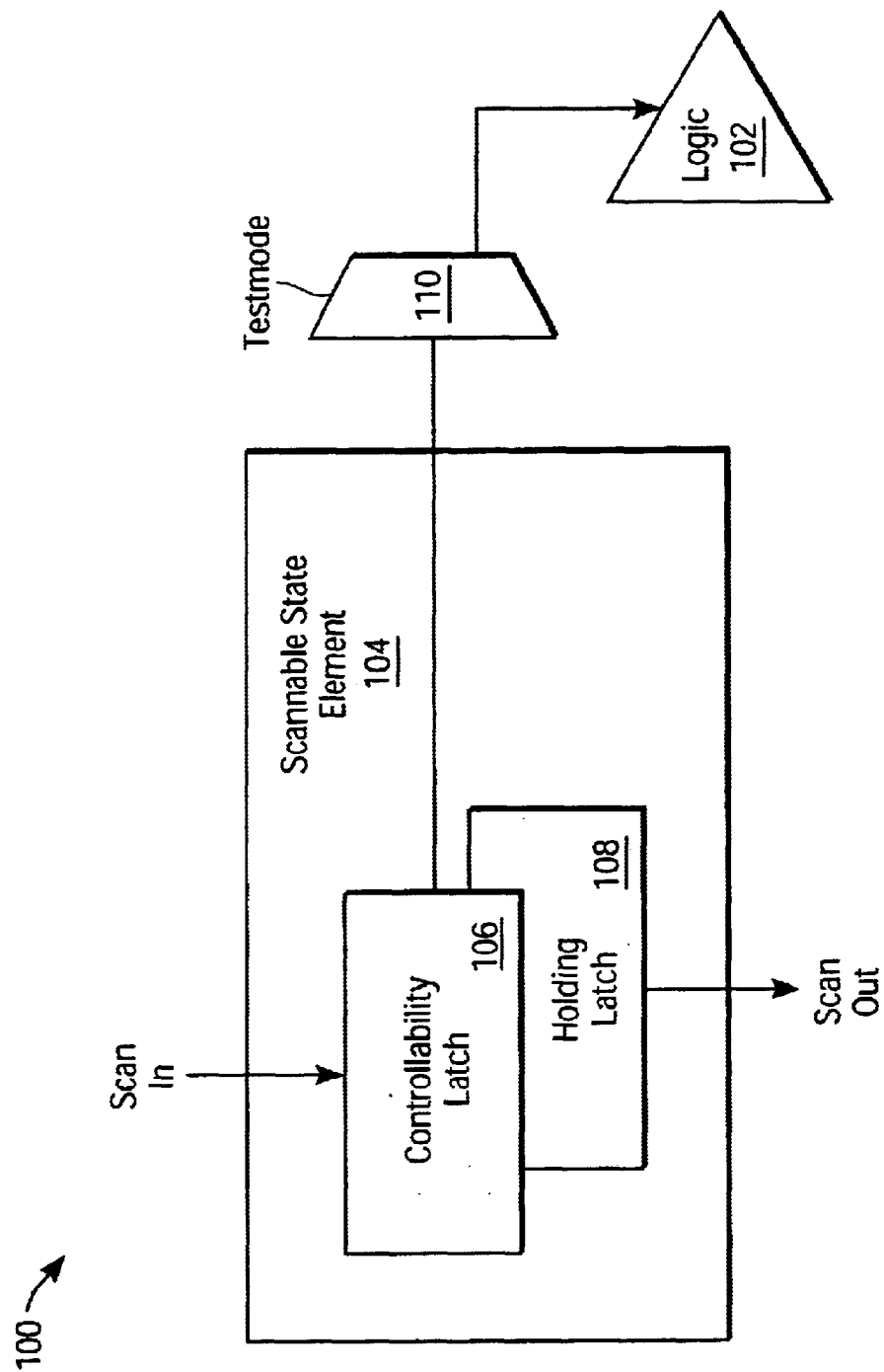
FIG. 1 is a schematic block diagram of one embodiment of a system for adding controllability to logic.

Referring to FIG. 1, a schematic diagram of a conventional scannable system 100 that provides observability is shown. The system 100 may include logic 102, such as a cone or block of logic 102. The system 100 may further include a scannable state element 104. The scannable state element 104 includes a functional latch or flip-flop 106, herein referenced as a controllability latch 106. The scannable state element 104 further includes a holding latch 108 coupled to the controllability latch 106. The holding latch 108 serves to capture and retain the content of the controllability latch 106.

The controllability latch 106 is coupled to a multiplexer 110, such as a 2-to-1 multiplexer 110. The multiplexer 110 receives the state value from the controllability latch 106 and further receives a testmode input. The testmode input provides testing and control of the logic 102 by enabling passage of a state value to the logic 102.

In testing operation, the state element 104 receives a scan in value. The scan in value may be a bit value of random data. The random data may be generated by a conventional pseudo-random pattern generator (PRPG)(not shown). Based on the scan in value, the controllability latch 106 passes a state value to the multiplexer 110 and to the logic 102. The holding latch 108 captures the scan in value and outputs a scan out value reflecting the scan in value. In this manner, the scannable state element 104 is able to inject a state value to control the logic 102. The response of the logic 102 to the injected state value may be scanned out or observed by a tester. The response may also be compressed into a special structure, such as a multiple input shift register (MISR), to produce a unique signature. The signature may then be reviewed to determine the validity of the system.

Figure 2:
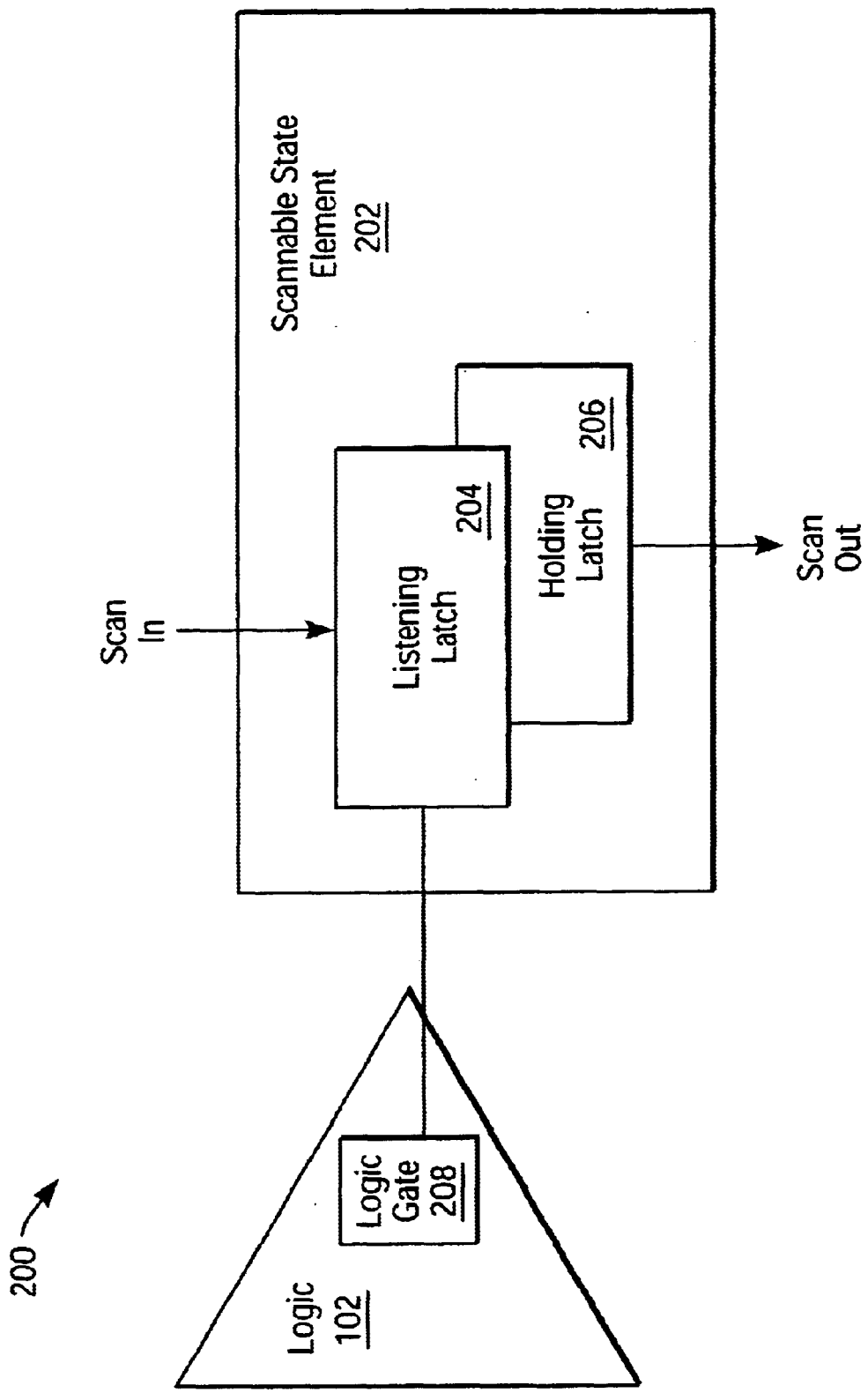
FIG. 2 is a schematic diagram of one embodiment of a system for adding observability to logic.

Referring to FIG. 2, a schematic diagram of a conventional scannable system 200 is shown. As with FIG. 1, the system 200 may include logic 102, such as a cone of logic 102. The system 200 may further include a scannable state element 202 having a functional latch or flip-flop 204, herein referenced as a listening latch 204. A holding latch 206 is coupled to the listening latch 204 and retains the content of the listening latch 204. The listening latch 204 is coupled to a logic gate 208 within the logic 102. The logic gate 208 provides state values from the logic 102 to enable observability of internal nodes within the logic 102.

The listening latch 204 captures state values from the logic 102 and scan out values. During scan operation, the holding latch 206 captures and retains listening latch 204 values. The holding latch 206 passes captured state values reflecting the internal nodes as scan out values. The scan out values may be compressed in a MISR to produce a unique signature that is reviewed during testing.

Figure 3:
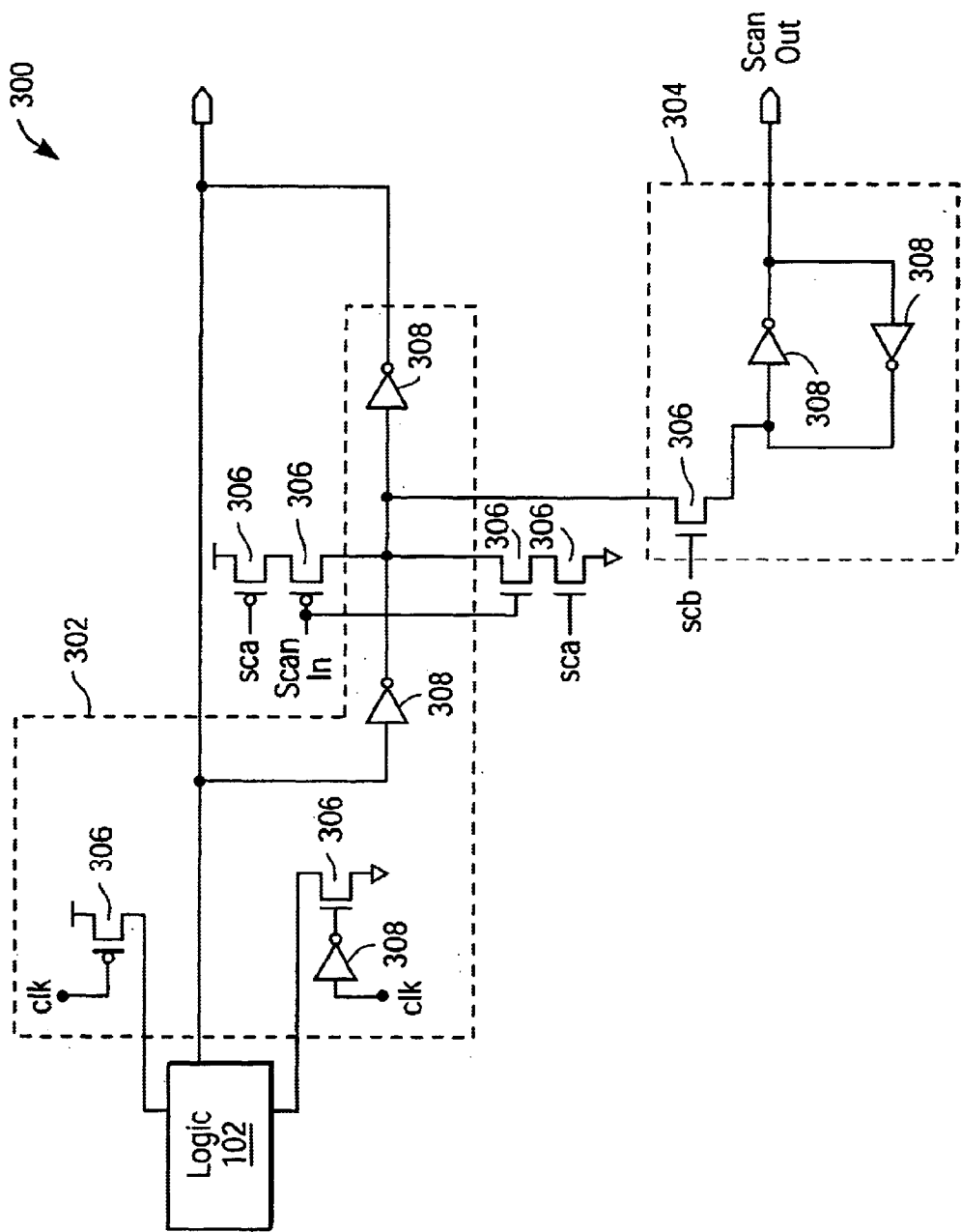
FIG. 3 is a schematic diagram of one embodiment of a functional latch and a holding latch.

Referring to FIG. 3, a more detailed schematic diagram of a scannable state element 300 is shown coupled to logic 102. The scannable state element 300 includes a functional latch 302 and a holding latch 304. The functional latch 302 may be a controllability latch 106 or a listening latch 204 depending on how it is coupled to the logic 102 such as through a multiplexer 110 (not shown) or a logic gate 208 (not shown). In one embodiment, the functional latch 302 may include transistors 306 and inverters 308 arranged as shown. The holding latch 304 may include a pair of inverters 308 in series. One of skill in the art will appreciate that the functional latch 302 and holding latch 304 may include various embodiments and such embodiments would be included within the scope of the invention.

In one embodiment, the functional latch 302 may be coupled to receive scan in, scan clock a (sca), and scan clock b (scb) through one or more transistors 306. In operation, scb is turned on to copy functional latch content into the holding latch 304. Sca may then be turned on to scan in a new value either from scan in or from a previous holding latch. The holding latch 304 couples to scan out to provide an outputted state value.

Figure 4:
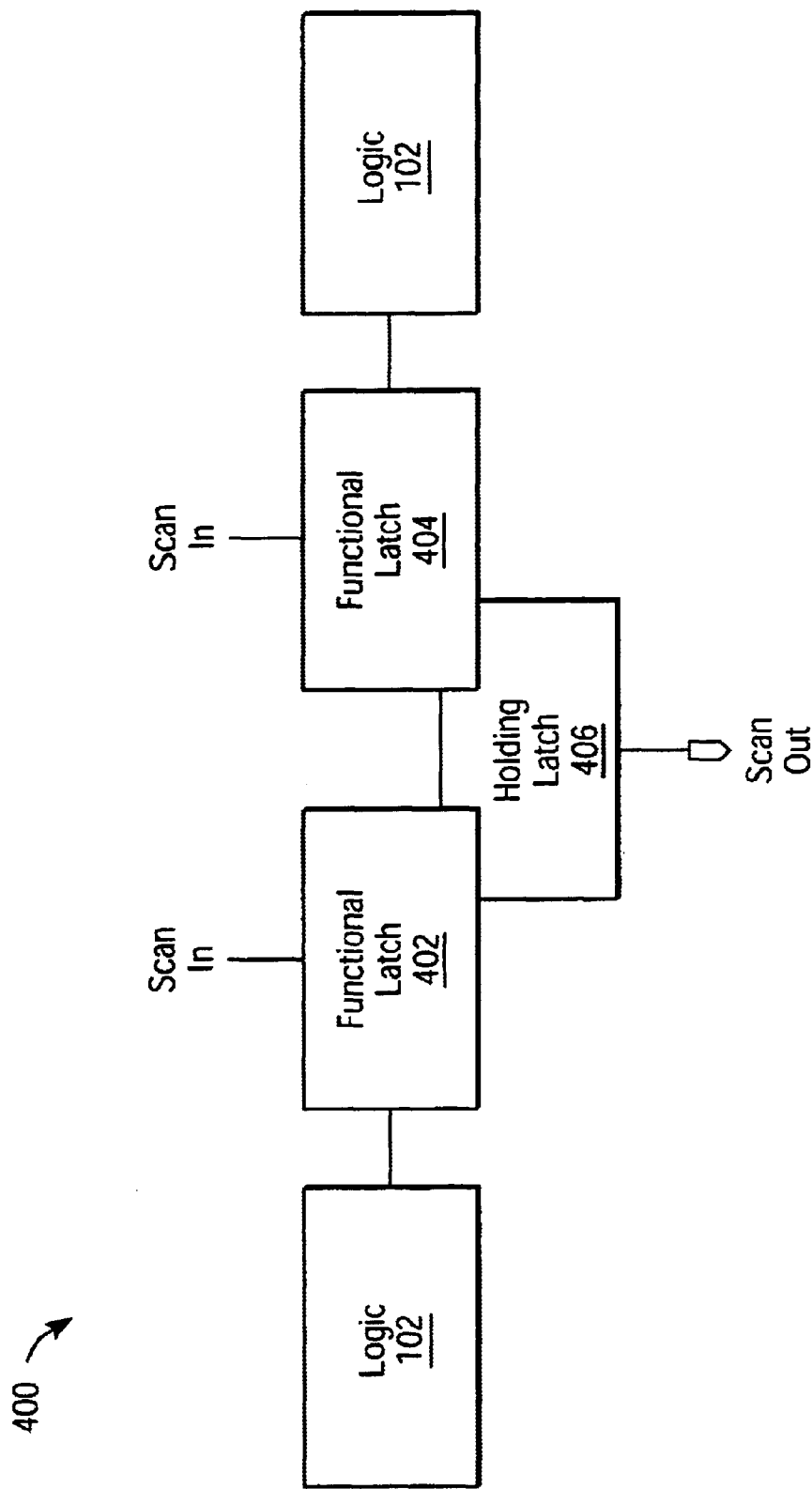
FIG. 4 is a schematic diagram of one embodiment of a system having functional latches sharing a holding latch in accordance with the present invention.

Referring to FIG. 4, a schematic diagram of a scannable system 400 is shown wherein two scannable functional latches 402, 404 share a holding latch 406. As can be appreciated, the functional latches 402, 404 may serve as controllability or listening latches to their respective logic 102. Depending on their function, the functional latches 402, 404 may couple to the logic 102 through a logic gate, multiplexer, or other components. Additional components are not shown in FIG. 4, because this illustration is concerned with the functional latches 402, 404 use of the holding latch 406 rather than their control or listening of the logic 102. By sharing a holding latch 406, the overhead for testing that is associated with scan design is reduced.

A limitation of this embodiment, is that the two functional latches 402, 404 cannot be scanned simultaneously. This is because each functional latch 402, 404 is disposed within its own scan chain. Simultaneous scanning would create a conflict in the use of the common holding latch 406. As such, the functional latches 402, 404 are disposed within separate scan chains that are scanned serially. Thus, a scan of a first scan chain may be completed and then a scan of a second scan chain may proceed. Alternatively, the scanning may alternate between the two scan chains in "leap-frog" fashion. Accordingly, a portion of the first scan chain may be scanned, and then a portion of the second chain, and then repeated until scans of both the first and second scan chains are completed.

One of skill in the art will appreciate that the invention is not limited to two functional latches 402, 404 sharing a common holding latch 406. Indeed, the present invention may be embodied with more than two functional latches sharing a common holding latch 406. Such a configuration requires alternating the scanning of the different scan chains having respective functional latches.

Figure 5:
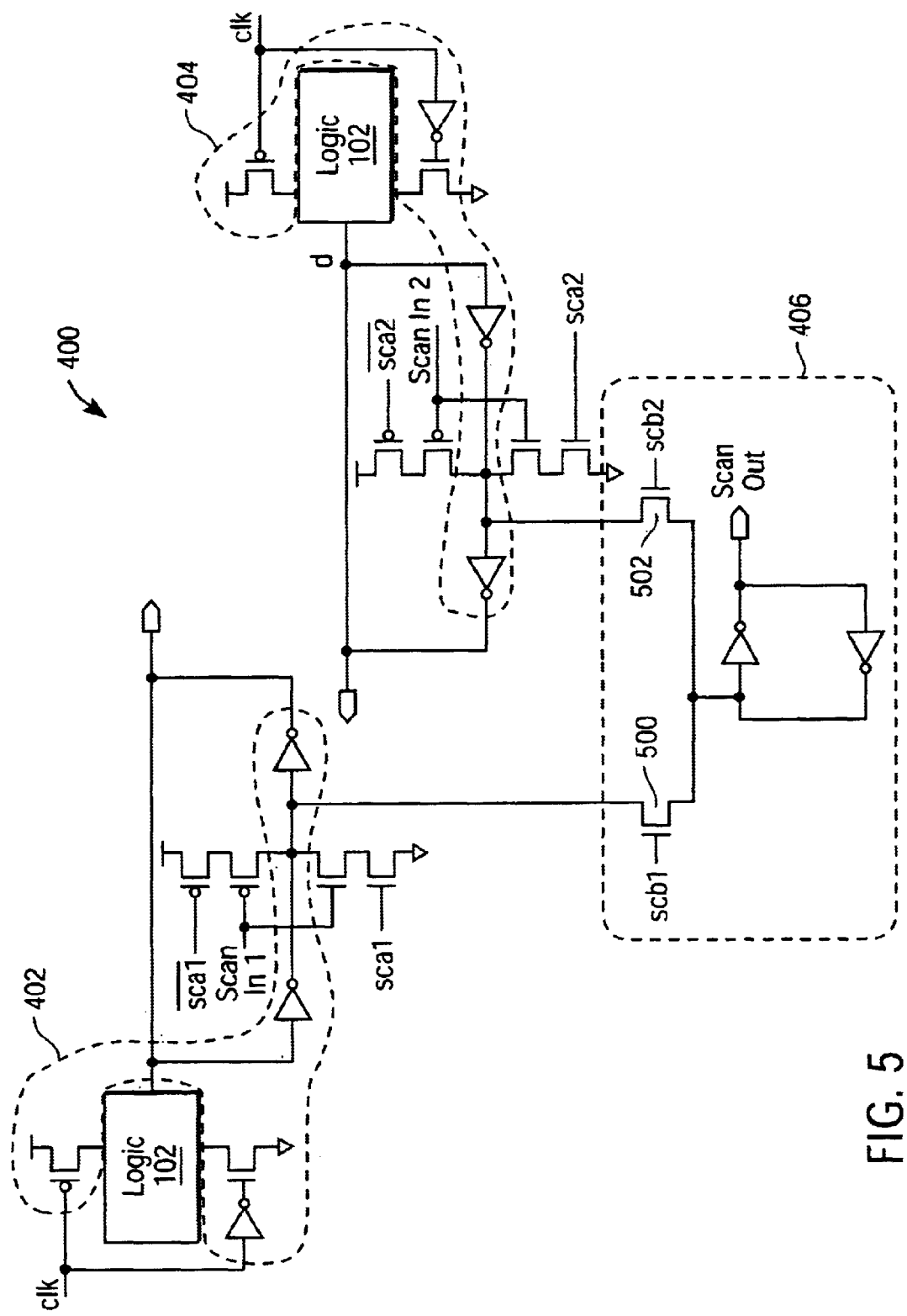
FIG. 5 is a more detailed schematic diagram of the embodiment of FIG. 4.

Referring to FIG. 5, a more detailed schematic diagram of the embodiment of FIG. 4 is shown. As shown, the functional latches 402, 404 may be similarly embodied as the functional latch 302 of FIG. 3. However, one of skill in the art will appreciate that the components of functional latches may vary and such variances are included within the scope of the invention.

In the embodiment shown, the holding latch 406 couples to the functional latches 402, 404 through respective transistors 500, 502. The transistors 500, 502 may be enabled by turning on scb 1 or scb 2. Thus, to scan in a new state value from functional latch 402, scb 1 is turned on. To scan in a new state value from functional latch 404, scb 2 is turned on. Scb 1 and scb 2 are not turned on simultaneously as that would create a conflict in the holding latch 406. The designs for coupling the holding latch 406 to the functional latches 402, 404 may vary and are not limited to the examples shown herein for illustrative purposes.

Figure 6:
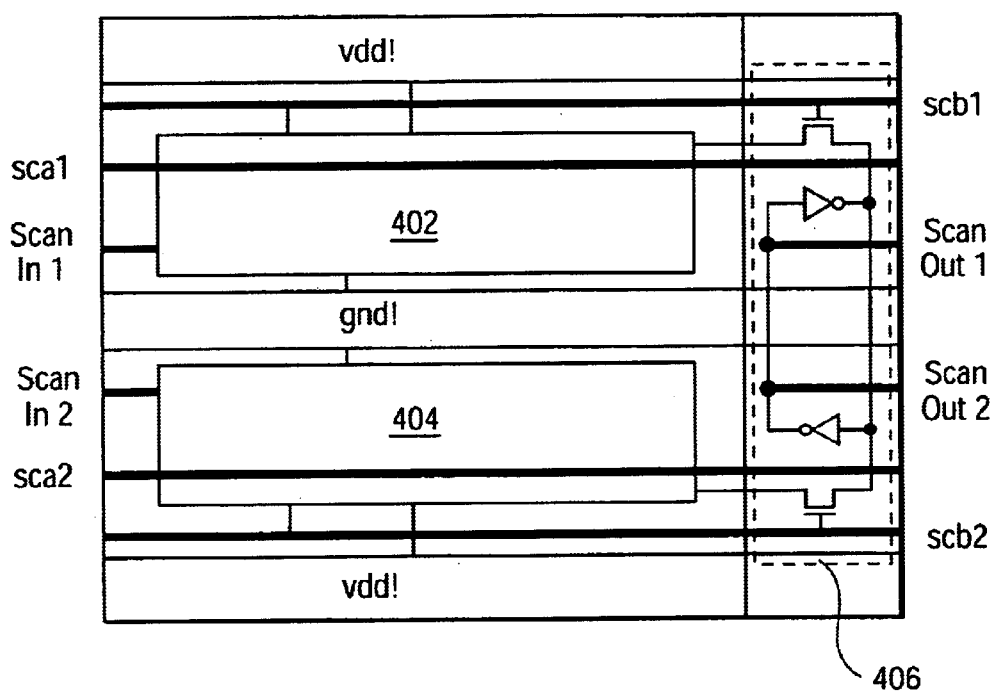
FIG. 6 is a plan view of a physical layout of the embodiment of the system of FIGS. 4 and 5.

Referring to FIG. 6, a plan view of a physical layout of the functional latches 402, 404 and the holding latch 406 is shown. The functional latches 402, 404 are shown in block diagram as their configuration may vary and is a matter of design choice. The functional latches 402, 404 are coupled to vdd!, gnd!, and to respective logic (not shown) to enable operation. The functional latches 402, 404 are further coupled to scan in 1 and scan in 2 to indicate that the latches 402, 404 are in separate scan paths. The functional latches 402, 404 are further coupled to respective sca 1 and sca 2 to enable copying of functional latch content into the holding latch 406. Scb 1 or scb 2 couple to the functional latches 402, 404 and allow a scan in of a new value to the holding latch from scan in 1 or scan in 2 respectively.

Figure 7:
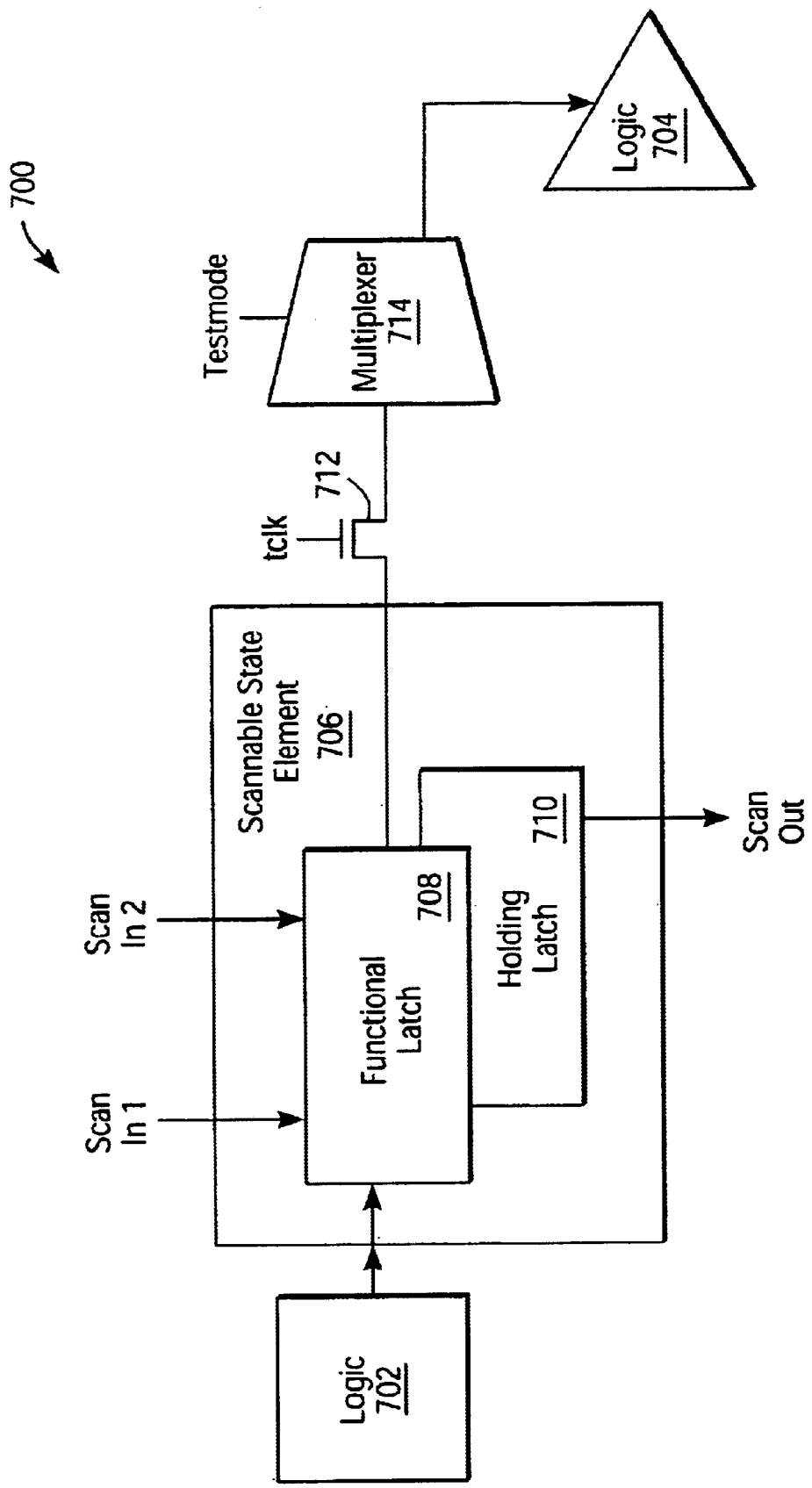
FIG. 7 is a schematic diagram of one embodiment of a system having logic share a functional latch in accordance with the present invention.

Referring to FIG. 7, a block diagram of an alternative embodiment of a scannable system 700 is shown. The system 700 includes first and second blocks of logic 702, 704 that are coupled to a scannable state element 706. The scannable state element 706 includes a functional latch 708 and a holding latch 710 that may be similarly configured to embodiments previously discussed.

The functional latch 708 may be used for testing the first logic 702, such as controlling, listening. The specific application of the functional latch 708 with respect to the first logic 702 may therefore vary. The functional latch 708 receives or delivers state values to and from the first logic 702.

The functional latch 708 further couples to the second logic 704. In one embodiment, the coupling may be achieved through a transistor 712. The transistor receives a clock signal, referred to as tclk. By turning tclk on, the functional latch 708 passes state values to the second logic 704. In the embodiment shown in FIG. 7, the functional latch 708 serves as a controllability latch for the second logic 704. Accordingly, the system 700 may further include a multiplexer 714 controlled by a testmode signal and coupled to the functional latch 708 and the second logic 704.

The functional latch 708 receives scan in 1 and scan in 2 that are representative of two different scan chains. Scan in 1 and scan in 2 would correspond with scan chains associated with first and second logics 702, 704. A limitation of the present invention is that first and second scan chains could not run simultaneously as they would conflict within the functional latch 708. A scan chain must first be completed before proceeding with the next scan chain. Alternatively, scan chains may be operated a portion at a time in an alternating "leap-frog" fashion. A scan out value is provided from the holding latch 710 as discussed in previous embodiments.

In the embodiment shown, two scan chains and two logics 702, 704 share a common scannable state element 706. By sharing the scannable state element 706, controllability of the second logic 704 is supported, servicing of the first logic 702 is supported, and overhead is reduced for scannability. Such sharing of a common scannable state element 706 may be referred to as "overloading" a state element. Overloading a scannable state element 706 in this manner will not likely result in charge leakage as the scan chains run separately through the state element 706.

Figure 8:
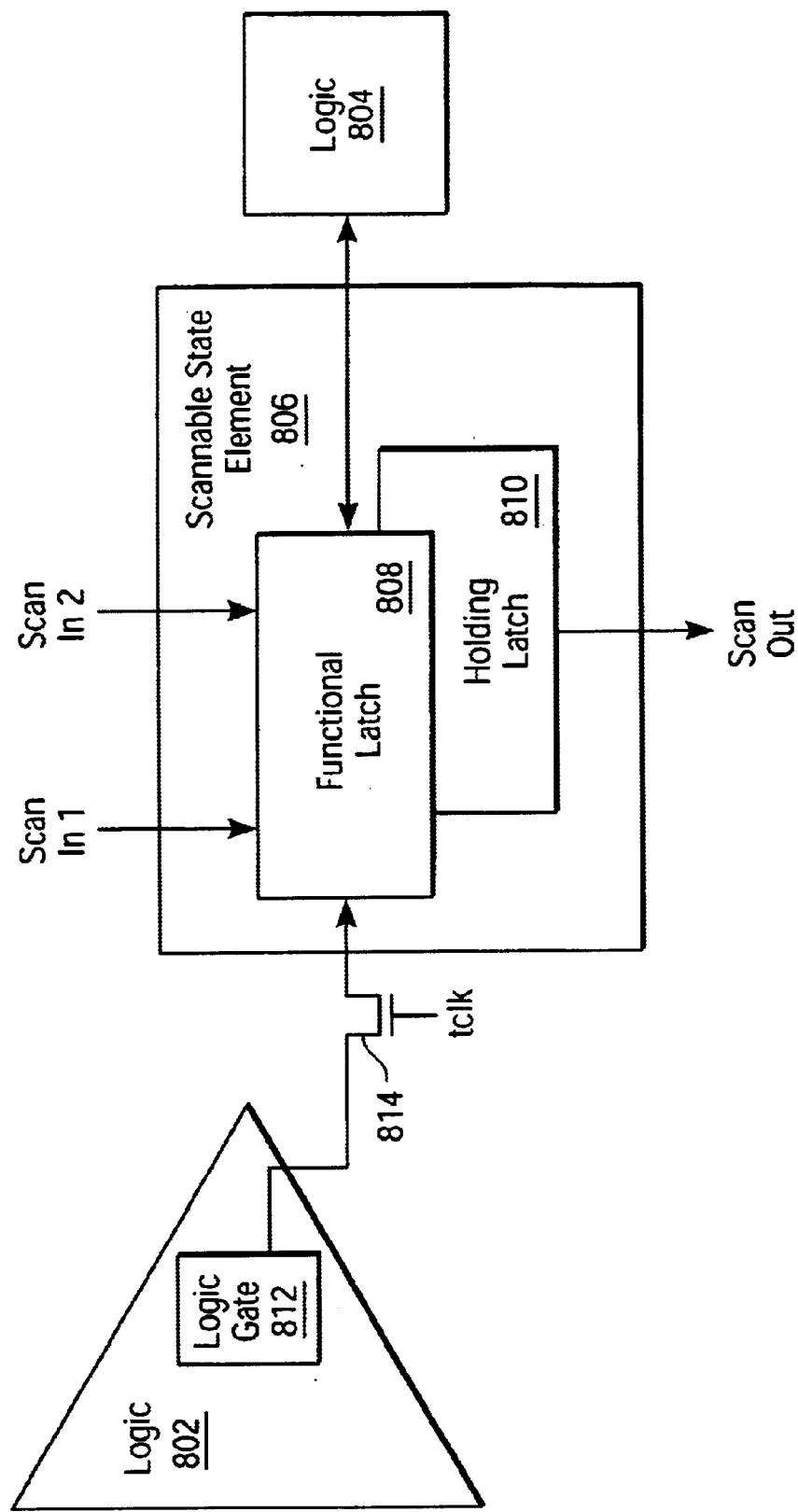
FIG. 8 is a schematic diagram of a system having logic share a functional latch in accordance with the present invention.

Referring to FIG. 8, a block diagram of an alternative embodiment of a scannable system 800 is shown. The system 800 includes first and second blocks of logic 802, 804 that couple to and share a scannable state element 806. The scannable state element 806 includes a functional latch 808 and a holding latch 810 that may be similarly configured to embodiments previously discussed.

The functional latch 808 serves as a listening latch to the first logic 802 and couples to a logic gate 812 within the logic 802. In one embodiment, the logic gate 812 may be embodied as a wide XOR gate. The first logic 802 may couple to the functional latch 808 through a transistor 814 that is enable by a clock value, referred to as tclk. By turning on the tclk, the functional latch 808 receives state values that reflect the internal nodes of the first logic 802. The internal nodes of the first logic 802 are thus captured and scanned out.

The functional latch 808 further couples to a second logic 804 to service the second logic 804 in any number of ways including controlling and listening. The specific application of the functional latch 808 with respect to the second logic 804 may therefore vary. As in the embodiment of FIG. 7, the functional latch 808 is shared by two separate scan chains and receives scan in values from scan in 1 and scan in 2. Testing of the logic 802, 804 and running of the two scan chains must be performed separately to prevent a conflict within the scannable state element 806.

The embodiments of FIG. 7 and 8 provide a design wherein two scan chains and two blocks of logic share a common scannable state element. In alternative embodiments, more than two scan chains and more than two blocks of logic share a common scannable state element. As can be appreciated, the scan chains do not run simultaneously due to conflicts in the scannable state element.

The invention provides an improved scannable design for built-in self testing (LBIST) of logic. The present invention improves controllability and observability by reducing overhead, reducing capacitive loading, reducing timing delays and improving overall performance of the circuit design. The present invention provides for sharing of a common holding latch by two or more functional latches. The present invention further provides for sharing of common scannable state elements by two or more blocks of logic.

As will be understood by those familiar with the art, the invention may be embodied in other specific forms without departing from the spirit or essential characteristics thereof. Likewise, the particular naming of the modules, features, attributes or any other aspect is not mandatory or significant, and the mechanisms that implement the invention or its features may have different names, structures, or formats. Also, the particular division of functionality may be varied such that different modules or components variously cooperate to achieve the results and functions described herein. Accordingly, the disclosure of the present invention is intended to be illustrative, but not limiting, of the scope of the invention, which is set forth in the following claims.

I claim:

1. A system for providing built-in scannability of a digital circuit design, comprising:
   a first functional latch coupled to a first logic block and to a first scan in input;
   a second functional latch coupled to a second logic block and to a second scan in input; and
   a holding latch coupled to the first and second functional latches and configured to communicate state values with the first and second functional latches and provide a scan out value.

2. The system of claim 1, wherein the holding latch couples to the first and second functional latches through first and second transistors and operation of the first and second transistors is enabled by first and second scan clock values.

3. The system of claim 1, wherein the holding latch comprises two inverters in series.

4. The system of claim 1, wherein the first and second scan in inputs deliver values from a pseudo-random pattern generator.

5. The system of claim 1, wherein the first functional latch is a controllability latch.

6. The system of claim 5, wherein the first functional latch is coupled to a multiplexor coupled to the first logic block.

7. The system of claim 1, wherein the first functional latch is a listening latch.

8. The system of claim 7, wherein the first logic block includes a logic gate and the first functional latch is coupled to the logic gate.

9. The system of claim 1, further comprising a third functional latch coupled to a third logic block and to the holding latch, the holding latch configured to receive state values from the third functional latch.

10. A system for providing built-in scannability of a digital circuit design, comprising:
    a first logic block;
    a second logic block; and
    a scannable state element coupled to the first and second logic blocks to communicate state values with the first and second logic blocks, the scannable state element further coupled to first and second scan in inputs and comprising a holding latch coupled to a scan out output.

11. The system of claim 10, wherein the scannable state element comprises:
    a functional latch coupled to the first and second scan in inputs and the holding latch.

12. The system of claim 11, wherein the functional latch serves as a controllability latch for the first logic block.

13. The system of claim 12, further comprising a multiplexor coupled to the functional latch and the first logic block, wherein the multiplexor passes state values to the first logic block.

14. The system of claim 13, further comprising a transistor coupled to the functional latch and the multiplexor, wherein the transistor is enabled by a clock value.

15. The system of claim 11, wherein the functional latch serves as a listening latch for the first logic block.

16. The system of claim 15, wherein the first logic block comprises a logic gate coupled to the functional latch, wherein the logic gate passes state values to the functional latch.

17. The system of claim 16, further comprising a transistor coupled to the functional latch and the logic gate, wherein the transistor is enabled by a clock value.

18. The system of claim 11, wherein the functional latch is coupled to the holding latch through a transistor, wherein the transistor is enabled by a clock value.

19. The system of claim 11, wherein the holding latch comprises a pair of inverters in series.

20. The system of claim 10, further comprising a third logic block coupled to the scannable state element to communicate state values.

21. A method for performing built-in scannability of a digital circuit design, comprising:
    coupling a first functional latch to a first scan in input and to a first logic block;
    coupling a second functional latch to a second scan in input and a second logic block;
    coupling a holding latch to the first and second functional latches;
    communicating state values between the holding latch and the first and second functional latches; and
    the holding latch providing a scan out value.

22. The method of claim 21, wherein coupling the holding latch to the first and second functional latches further comprises:
    coupling first and second transistors between the first and second functional latches and the holding latch; and
    transmitting scan clock values to the first and second transistors.

23. The method of claim 21, further comprising a pseudo-random pattern generator delivering values to the first and second scan in inputs.

24. The method of claim 21 further comprising coupling the first functional latch and the first logic block to a multiplexer thereby providing controllability to the first logic block.

25. The method of claim 21 further comprising coupling the first functional latch to a logic gate within the first logic block thereby enabling listening of the first logic block.

26. A method for performing built-in scannability of a digital circuit design, comprising:
    coupling a first logic to a scannable state element to enable communication of state values;
    coupling a second logic block to the scannable state element to enable communication of state values;
    coupling the scannable state element to first and second scan in inputs; and
    the scannable state element comprising a holding latch, the holding latch coupled to the first and second logic blocks to receive a scan out output.

27. The method of claim 26 further comprising the scannable state element delivering state values to the first logic block to effect control of the first logic block.

28. The method of claim 27 further comprising coupling a multiplexor to the scannable state element and the first logic block.

29. The method of claim 26, further comprising the scannable state element receiving state values from the first logic block to enable listening of the first logic block.

30. The method of claim 29, further comprising coupling the scannable state element to a logic gate within the first logic block.

31. The method of claim 26, wherein the scannable state element comprises:
    a functional latch coupled to the holding latch.

* * * * *